United States Patent
Yamazaki et al.

(10) Patent No.: US 6,593,216 B1
(45) Date of Patent: Jul. 15, 2003

(54) METHOD FOR PRODUCING SEMICONDUCTOR DEVICE

(75) Inventors: Shunpei Yamazaki, Tokyo (JP); Koichiro Tanaka, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/226,177

(22) Filed: Jan. 4, 1999

Related U.S. Application Data

(63) Continuation of application No. 08/694,497, filed on Aug. 7, 1996, now Pat. No. 5,858,822.

(30) Foreign Application Priority Data

Aug. 7, 1995 (JP) .................................. 7-222563

(51) Int. Cl.[7] .................. H01L 21/00; H01L 21/20; H01L 21/84
(52) U.S. Cl. ............... 438/487; 438/149; 438/151; 438/166
(58) Field of Search ............... 438/166, 487, 438/486, 149, 151

(56) References Cited

U.S. PATENT DOCUMENTS

| | | | | |
|---|---|---|---|---|
| 5,346,850 A | * | 9/1994 | Kaschmitter | 438/487 |
| 5,382,548 A | * | 1/1995 | Lee | 437/233 |
| 5,561,081 A | * | 10/1996 | Takenouchi | 438/166 |
| 5,583,369 A | * | 12/1996 | Yamazaki et al. | 257/635 |
| 5,907,770 A | | 5/1999 | Yamazaki et al. | 438/149 |

FOREIGN PATENT DOCUMENTS

| | | |
|---|---|---|
| JP | 64-76715 | 3/1989 |
| JP | 2-78217 | * 3/1990 |
| JP | 2-110914 | 4/1990 |
| KR | 1992-0007589 | 12/1993 |

OTHER PUBLICATIONS

Yamazaki, et al., U.S. Ser. No. 08/685,752, "Laser ANnealing Method and Apparatus", filed Jul. 24, 1996.

* cited by examiner

*Primary Examiner*—Amir Zarabian
*Assistant Examiner*—Toniae M. Thomas
(74) *Attorney, Agent, or Firm*—Fish & Richardson P.C.

(57) ABSTRACT

In irradiating and scanning an amorphous silicon film formed on the glass substrate with a linear laser beam, the glass substrate is placed so as to assume a convex surface. In a heated state, the amorphous silicon film is irradiated and scanned with the linear laser beam having an inverted-U-shaped focus line that approximately coincides with the convex surface. Slow cooling is thereafter performed. A silicon film having uniform crystallinity is formed on a glass substrate having flat surface. Also, A thin film transistor (TFT) having a uniform threshold voltage is produced by using the crystalline silicon film.

25 Claims, 13 Drawing Sheets

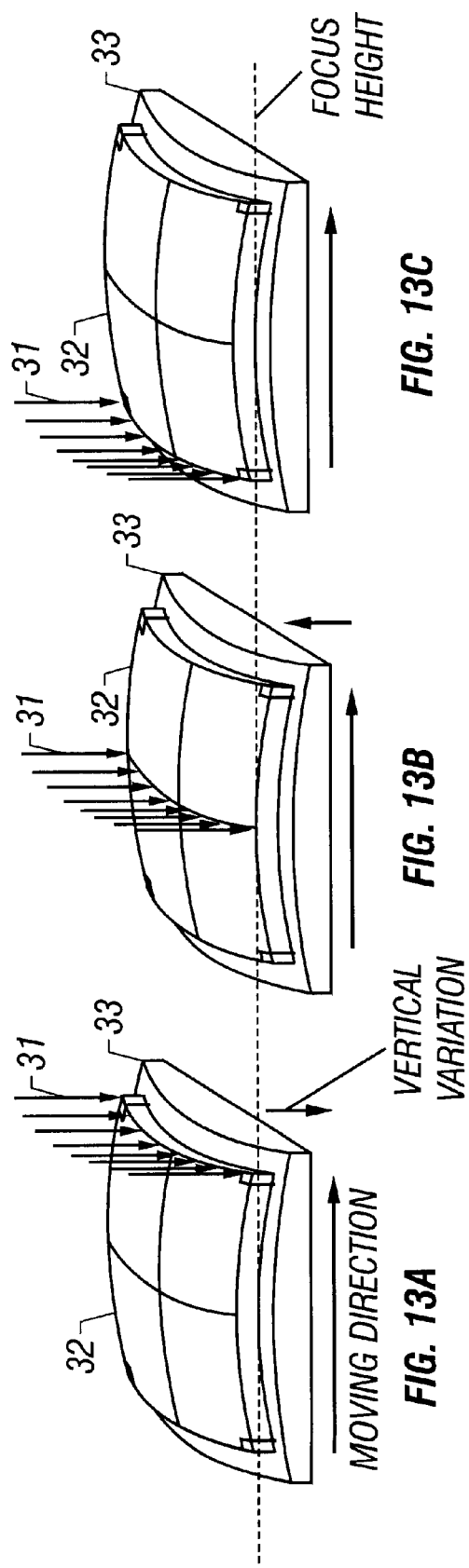

US 6,593,216 B1

METHOD FOR PRODUCING SEMICONDUCTOR DEVICE

This is a continuation of U.S. application Ser. No. 08/694,497, filed Aug. 7, 1996, now U.S. Pat. No. 5,858,822.

BACKGROUND OF THE INVENTION

1. Field of the Invention

The present invention relates to a semiconductor producing method of forming a highly uniform crystalline silicon film in processes relating to manufacture of insulated-gate semiconductor devices such as thin-film transistors (TFTs) which are formed by using a non-single-crystal, crystalline silicon film provided on a glass substrate, and other semiconductor devices. In particular, the invention is effective in forming a semiconductor device on a glass substrate.

2. Description of the Related Art

In recent years, insulated-gate field-effect transistors having a thin-film active layer (or active region) on an insulative substrate, i.e., thin-film transistors (TFTs), have been studied eagerly.

The TFTs are classified into an amorphous silicon TFT, a crystalline silicon TFT, etc. by the semiconductor material used and its crystal state. The "crystalline silicon" does not always mean single crystal silicon but may mean non-single crystal silicon in some cases. TFTs using the latter are generally called non-single-crystal silicon TFTs.

In general, amorphous semiconductors have a small electric field mobility, which therefore cannot be used for TFTs that are required to operate at high speed. Further, amorphous silicon can provide only a very small P-type electric field mobility, it does not allow formation of a P-channel TFT (i.e., PMOS TFT), so that a complementary MOS (CMOS) circuit cannot be formed by combining P-channel TFTs and N-channel TFTs (NMOS TFTs).

In contrast, since crystalline semiconductors have larger electric field mobilities than amorphous semiconductors, they allows high-speed operation of TFTs. Further, allowing formation of not only an NMOS TFT but also a PMOS TFT, crystalline silicon enables formation of a CMOS circuit.

A non-single-crystal silicon film is obtained by forming an amorphous silicon film by vapor-phase growth and then thermally annealing it for a long time at a proper temperature (usually higher than 600° C.) or irradiating it with strong light such as laser light (optical annealing).

However, where a glass substrate, which is inexpensive and highly workable, is used as an insulative substrate, it is very difficult to form, only by thermal annealing, a crystalline silicon film having a sufficiently large electric field mobility (to allow formation of a CMOS circuit). This is because a glass substrate generally has a low strain temperature (about 600° C.) and therefore it is distorted when its temperature is increased to a value that is necessary to form a crystalline silicon film having a sufficiently high mobility.

On the other hand, where optical annealing is used to crystalline a silicon film formed on a glass substrate, high energy can be applied to only the silicon film without much increasing the temperature of the substrate. The optical annealing is thus very effective for crystallization of a silicon film formed on a glass substrate.

At present, large output pulsed lasers such as excimer lasers are considered most suitable for a light source for optical annealing. Since those lasers have much larger maximum energies than CW lasers such as an argon ion laser, they allow use of a beam spot as large as several square centimeters, thus contributing to increase of the productivity.

However, to process a large-area substrate with an ordinary square or rectangular beam, it is necessary to move the beam in the two orthogonal directions. This is an item to be improved to increase the productivity.

This item can be greatly improved by deforming a beam into a linear shape that is longer than the width of a substrate to be processed and scanning the substrate with the beam relatively. (The scanning is performed by moving a linear laser beam in small steps with overlaps.) Details are described in Japanese Unexamined Patent Publication No. 5-112355.

A crystalline silicon film having a higher degree of crystallinity can be obtained by performing thermal annealing before the optical annealing. As for the method of thermal annealing, as disclosed in Japanese Unexamined Patent Publication No. 6-244104, a crystalline silicon film can be obtained at a lower temperature and in a shorter time than the case of using ordinary thermal annealing by utilizing the fact that such elements as nickel, iron, cobalt, platinum, palladium (hereinafter referred to as "crystallization catalyst elements" or simply "catalyst elements") have an effect of accelerating crystallization of amorphous silicon.

TFTs were formed in matrix form by using a crystalline silicon film formed by a conventional method in which an amorphous silicon film was formed on a glass substrate, annealed, and then subjected to laser annealing with a linear laser beam, and a distribution of their threshold voltages in the substrate surface was examined, which is shown in FIG. 2. It is seen from FIG. 2 that the distribution assumes a U-shape.

FIG. 4 shows an arrangement of TFTs on a glass substrate. In FIG. 4, TFTs are arranged in a matrix of 400×300 in an area of 40 mm×50 mm of a 100 mm×100 mm Corning 7059 substrate. In the data of FIG. 2, the horizontal axis shows positions of 400 TFTs on a horizontal full row (enclosed by a broken line in FIG. 4) of the substrate at the center in the vertical direction.

If TFTs of a pixel matrix that constitutes a pixel area of a liquid crystal display has the distribution of threshold voltages as shown in FIG. 2, there may occur display unevenness or an image defect.

An investigation into the cause of the above U-shaped distribution of threshold voltages in the substrate surface has revealed that it is very similar to a warp in a substrate immediately before application of laser light.

It has also been found that a glass substrate does not have a warp immediately after formation of an amorphous silicon film thereon and a warp occurs due to the fact that the silicon film contracts more than the glass substrate when the substrate is cooled after a heat treatment for crystallizing the amorphous silicon film by solid-phase growth. The warp occurs so as to be concave toward the film forming surface of a substrate.

FIG. 3 shows how laser annealing is performed with linear laser light 2 on a silicon substrate formed on a warped glass substrate 1. In FIG. 3, if the warped substrate 1 is subjected to laser annealing, the substrate surface deviates from focuses 3 of laser light differently at respective positions. It is considered that these deviations cause the silicon film to have different degrees of crystallinity in the substrate surface, so that threshold voltages exhibit a particular distribution in the substrate surface.

In the substrate with which the data of FIG. 2 was obtained, the overall depth of the U shape of the warped substrate was about 50 μm immediately before the application of laser light.

The degree of warp depends on the temperature and time of the heat treatment, the substrate material, and other factors. In the case of a 100 mm×100 mm substrate, the depth of the U shape generally fell within the range of 20 to 200 μm.

A concave warp occurred not only after the thermal crystallization of an amorphous silicon film formed on a glass substrate but also after slow cooling that was performed after an amorphous silicon film was subjected to laser annealing while being heated.

SUMMARY OF THE INVENTION

An object of the present invention is to provide a method for forming a crystalline silicon film on a glass substrate which film has a uniform distribution of crystallinity in the substrate surface.

Another object of the invention is to provide a method for forming crystalline silicon thin film transistors (TFTs) on a glass substrate which TFTs have a uniform distribution of threshold voltages in the substrate surface.

Another object of the invention is to provide a producing method which provides a uniform distribution of crystallinity in the substrate surface in a process of forming a crystalline silicon film on a glass substrate which process includes a thermal annealing step and a subsequent laser annealing step, and which method forms crystalline silicon TFTs having a uniform distribution of threshold voltages in the substrate surface by using the silicon film thus obtained.

Another object of the invention is to obtain a flat substrate after slow cooling that is performed after an amorphous or crystalline silicon film is subjected to laser annealing while being heated.

To attain the above objects, according to the invention, there is provided a producing method of a semiconductor device, wherein a linear laser beam that is applied to an uneven irradiation surface on which a semiconductor film is formed has a focus line that extends in a longitudinal direction of the linear laser beam and approximately coincides with a sectional shape of the irradiation surface.

According to the invention, there is provided a producing method of a semiconductor device, wherein in irradiating and scanning a semiconductor film formed on an uneven surface with a linear laser beam, the linear laser beam has a focus line that extends in a longitudinal direction thereof and approximately coincides with a sectional shape of the irradiation surface.

According to the invention, there is provided a producing method of a semiconductor device, comprising, in irradiating and scanning an amorphous silicon film formed on a glass substrate with a linear laser beam, the steps of: placing the glass substrate so as to have a convex surface; irradiating and scanning, in a heated state, the amorphous silicon film with the linear laser beam having an inverted-U-shaped focus line that approximately coincides with the convex surface; and performing cooling.

According to the invention, there is provided a producing method of a semiconductor device, comprising, in converting an amorphous silicon film formed on a glass substrate into a crystalline silicon film by heating and irradiating and scanning the crystalline silicon film with a linear laser beam, the steps of: placing the glass substrate so as to have a convex surface; irradiating and scanning, in a heated state, the crystalline silicon film with the linear laser beam having an inverted-U-shaped focus line that approximately coincides with the convex surface; and performing cooling.

In the above producing methods, as the amorphous or crystalline silicon film is irradiated and scanned with the linear laser beam having the inverted-U-shaped focus line, the glass substrate or the focus line of the linear laser beam may be moved in the height direction of the glass substrate in accordance with a variation of the height of the convex surface in the scanning direction.

According to the invention, there is provided a producing method of a semiconductor device, comprising, in irradiating and scanning an amorphous silicon film formed on a glass substrate with a linear laser beam, the steps of: placing the glass substrate so that it assumes an inverted-U-shaped convex surface; irradiating and scanning, in a heated state, the amorphous silicon film with the linear laser beam having an inverted-U-shaped focus line that approximately coincides with the inverted-U-shaped convex surface; and performing cooling. According to still another aspect of the invention, there is provided a producing method of a semiconductor device, comprising, in converting an amorphous silicon film formed on a glass substrate into a crystalline silicon film by heating and irradiating and scanning the crystalline silicon film with a linear laser beam, the steps of: placing the glass substrate so that it assumes an inverted-U-shaped convex surface; irradiating and scanning, in a heated state, the crystalline silicon film with the linear laser beam having an inverted-U-shaped focus line that approximately coincides with the inverted-U-shaped convex surface; and performing cooling.

In the above producing methods, the glass substrate may placed on a stage having a convex surface or an inverted-U-shaped convex surface while end portions of the glass substrate are pressed against the stage.

It is preferred that the heated state is such that the temperature of the glass substrate be kept in a range from a temperature higher than the room temperature to 70% of the strain absolute temperature of the glass substrate.

The heating of the glass substrate may be performed by heating a helium gas with a heater that is provided under the glass substrate and circulating the heated helium gas under the glass substrate.

In each of the above producing methods, it is preferred that the energy density profile of the linear laser beam in its width direction satisfy inequalities $0.5L1 \leq L2 \leq L1$ and $0.5L1 \leq L3 \leq L1$ where L1 is a beam width at an energy density that is 95% of a maximum energy density and L1+L2+L3 is a beam width at an energy density that is 70% of the maximum energy density, L1 and L3 corresponding to both side portions of the energy density profile. In particular, it is preferred that the linear laser beam have a depth of focus that is about ±400 μm.

As described above, according to the invention, a flat glass substrate on which an amorphous silicon film is formed or a glass substrate that is warped toward the film coating side after thermal crystallization of the amorphous silicon film is placed on the stage having a convex surface or an inverted-U-shaped convex surface so as to conform to such a surface. While this state is maintained and the glass substrate is kept at a particular temperature within a range from a temperature higher than the room temperature to 70% of the strain temperature (absolute temperature) of the glass substrate, a linear laser beam having a focus line that coincides with the curved surface of the glass substrate is applied to the amorphous or crystalline silicon film formed on the glass substrate. Thereafter, cooling is performed.

In the cooling that is performed after the laser light irradiation, the silicon film contracts more than the glass substrate. As a result, the glass substrate is changed from the curved state to a flat state.

In the above manner, a crystalline silicon film having a uniform distribution of crystallinity can be formed and the glass substrate can be made flat. A crystalline silicon film having a uniform mobility distribution in the substrate surface can be obtained. Further, TFTs having uniform characteristics can be obtained, and a liquid crystal electro-optical device using those TFTs can be produced. Since the glass substrate is flat, the liquid crystal electro-optical device can be produced easily with high accuracy.

The convex surface of the stage is so designed that a glass substrate bearing a silicon film is rendered flat by the slow cooling that is performed after the laser light irradiation.

To realize the above producing process, in performing laser annealing by using a linear laser beam, the focus line of the irradiation laser beam is made to coincide with a shape of an irradiation surface (i.e., a sectional shape in the beam longitudinal direction at a linear laser beam irradiating position). Thus, uniform laser annealing is performed on a curved irradiation surface.

FIG. 1 shows an example of a linear laser beam 11 having an inverted-U-shaped focus line. If the irradiation surface has an inverted-U shape 12 as obtained when the substrate is curved in one direction, a linear laser beam 11 having an inverted-U-shaped focus line that conforms to the curved surface in its longitudinal direction is applied to the irradiation surface through an optical system 10 so that the focus line is located on the irradiation surface, as shown in FIG. 1.

FIG. 12 shows an example of a laser light irradiation method. As shown in FIG. 12, while a linear laser beam 21 having an inverted-U-shaped focus line 20 is applied so that the focus line 20 is located on a curved surface of a glass substrate 23 that is placed on a stage 22, the stage 22 is moved relative to the laser beam 21 in its width direction (indicated by an arrow). Thus, laser annealing that is uniform in the substrate surface can be performed on the curved irradiation surface.

On the other hand, if an irradiation surface has not a simple inverted-U shape but a convex shape in which the center of the surface is high and the periphery is low, the irradiation surface has a height difference not only in the longitudinal direction of a linear laser beam but also in its width direction (i.e., movement direction).

FIG. 13 shows another example of a laser light irradiation method. In this case, as a linear laser beam 31 having an inverted-U-shaped focus line is applied, a stage 33 on which a glass substrate 32 is placed is moved in the height direction as well as in the horizontal direction (indicated by arrows) so that the irradiation surface always coincides with the focus position (indicated by a broken line) of the laser beam 31.

The position of the focus of the laser beam 31 may be controlled by adjusting the lens position while the height of the stage 33 on which the substrate 32 is placed is fixed.

The above control operations may be performed based on such data as a known thickness of the substrate and the shape of a convex surface. Alternatively, the height of the substrate 32 or the focus line may be changed automatically based on the height variation of the irradiation surface which is measured with a laser displacement meter or the like.

To use a linear laser beam having an inverted-U-shaped focus line in its longitudinal direction in performing laser annealing on a glass substrate that is forced to assume a convex surface, a cylindrical lens through which the linear laser beam passes immediately before striking the irradiation surface should have different focal lengths in the longitudinal direction; for instance, it should have an inverted-U-shaped cross-section.

FIG. 9 shows a cylindrical lens 41 having different focal lengths in the longitudinal direction, which is composed of a plurality of cylindrical lenses 41a to 41e having different focal lengths.

FIG. 10 shows another cylindrical lens 42 having different focal lengths in the longitudinal direction, which is constructed such that the plurality of cylindrical lenses 41a to 41e of FIG. 9 are smoothly connected to each other. The cylindrical lens 42 can provide a finer focus line. The cylindrical lens 42 can also provide a variety of focus line shapes other than the inverted-U shape to accommodate various surface shapes of irradiation objects.

In addition to the above producing methods, it is effective to make a laser beam have the following energy density profile.

FIGS. 15A and 15B show laser beam energy profiles. In the invention, a laser beam may have, at the focus, not only a conventional, ordinary rectangular energy density profile shown in FIG. 15A in the width direction but also a trapezoidal one shown in FIG. 15B.

In the laser beam energy density profiles of FIGS. 15A and 15B, with an assumption that the maximum energy density of a laser beam is 1, a beam width at an energy density of 0.95 is represented by L1 and a beam width at an energy density 0.75 is represented by L1+L2 and L3 where L2 and L3 correspond to both side portions of the beam width.

According to the above definitions, a laser beam having a rectangular energy density profile satisfies $0.5L1 > L2$ (or L3). L2 and L3 are not shown in FIG. 15A because they are very small.

Although a rectangular laser beam has a high energy density on the irradiation surface, its depth of focus is narrower than about $\pm 200 \, \mu m$. Where the irradiation surface has asperities or undulation, a rectangular laser beam more likely cause a non-uniform distribution of crystallinity than a laser bean having the above-mentioned trapezoidal energy density profile.

On the other hand, the energy density profile shown in FIG. 15B satisfies both inequalities $0.5L1 \leq L2 \leq L1$ and $0.5L1 \leq L3 \leq L1$ in the width direction of a linear laser beam.

A laser beam having the trapezoidal energy density profile can have a depth of focus that is narrower than about $\pm 400 \, \mu m$. Where the irradiation surface has asperities or undulation, a laser beam having the trapezoidal energy density profile provides a higher degree of uniformity than a laser beam having the rectangular energy density profile. Further, a trapezoidal laser beam can provide an energy density sufficient for crystallization.

Although a trapezoidal or triangular energy density profile where L2 (or L3)>L1 can provide a depth of focus wider than $\pm 400 \, \mu m$, it is associated with a problem of difficulty in focus adjustment. Further, since the energy density is low, it is likely that the crystallization of a silicon film becomes insufficient, in which case a desired mobility may not be obtained.

Thus, in irradiating a convex surface or an inverted-U-shaped convex surface with a linear laser beam having an inverted-U-shaped focus line, a depth of focus wider than in the case of using a laser beam having the conventional rectangular energy density profile can be obtained by employing a laser beam having the trapezoidal energy density profile in the width direction which satisfies the above inequalities.

FIGS. 16A and 16B show an example of a laser light irradiation method with a linear laser beam having the trapezoidal energy density profile.

In FIG. 16A, by giving the trapezoidal energy density profile to a linear laser beam 51 having an inverted-U-shaped focus line, a silicon film formed on a substrate 53 can be crystallized sufficiently and uniformly with only horizontal movement of a stage 52 if the height difference due to asperities, undulation, etc. of the irradiation surface of the substrate 53 falls within the range of ±400 μm. That is, it is not necessary to move the substrate 53 in the height direction, contributing to simplification of the apparatus and reduction of the cost.

If a laser beam having the trapezoidal energy density profile is used in addition to moving the substrate in the height direction, the focusing margin in the height direction can be increased from the conventional case. Naturally the focusing margin with respect to a height difference of the irradiation surface in the longitudinal direction of a linear laser beam can be increased.

Where the irradiation surface is a convex surface that is not a clear inverted-U shape, the shape of the irradiation surface may not be straight in the substrate movement direction. Therefore, there is a possibility that even if a laser beam has an inverted-U-shaped focus line, it comes out of focus with the irradiation surface.

To solve this problem, a laser beam having a trapezoidal energy density profile and a wide depth of focus is used. As a result, as shown in FIG. 16B, with an inverted-U-shaped focus line 62 of a laser beam 61, the margin is increased as much as an increase in the depth of focus 63, so that the uniformity in the longitudinal direction (horizontal direction on the paper surface of FIG. 16B) can be improved.

When a linear laser beam having a trapezoidal energy density profile is moved relative to the substrate in the width direction of the laser beam (i.e., perpendicularly to its longitudinal direction) with overlaps of beams, due to gradients in the energy density profile of the laser beam, an arbitrary point on the irradiation surface is first irradiated with weak laser beams. Thereafter, at that point, the intensity of laser beams gradually increases, and then gradually decreases, thus completing the irradiating operation.

FIG. 17 shows how laser light irradiation is performed with a linear laser beam having a trapezoidal energy density profile. The laser beam energy density gradually increases in the head portion of the laser light irradiation (indicated by A in FIG. 17) and gradually decreases in the end portion (indicated by B in FIG. 17). Thus, when a linear laser beam having the above trapezoidal energy density profile is used, the variation in the density of energy supplied to the irradiation area becomes much gentler than in the case of using a linear laser beam having the conventional rectangular energy density profile.

This type of laser light irradiation can provide effects equivalent to those obtained by the conventional two-step irradiation in which low-energy-density laser light is applied first (preliminary irradiation) and then high-energy-density laser light is applied (main irradiation).

As a result, abrupt phase changes can be prevented from occurring in a laser-light-irradiated amorphous silicon film, whereby surface roughening and accumulation of internal stress can be prevented. Thus, a uniform distribution of crystallinity can be attained.

In the invention, a substrate heating method as shown in FIG. 14 enables efficient heating during the laser light irradiation. That is, in a state that a substrate 71 is fixed to a stage 73 by means of holding members 72, a helium gas 75 is heated with a heater 74 that is installed under the stage 73 and the heated helium gas 75 is circulated under the substrate 71 by a pump 76, whereby the substrate 71 can be kept at a desired temperature. The reason for using the helium gas 75 is its large heat conductivity.

The inventors checked influences on the substrate shape of every producing step for forming TFTs on a substrate, and found that substrate deformation due to a heat treatment for crystallizing a silicon film was most remarkable. No marked deformation was found after that step.

Therefore, if a substrate is very flat after thermal crystallization or laser light irradiation in a heated state, the substrate can be kept in a fairly flat state even after completion of the entire process. For this reason, by performing laser annealing on a silicon film that is formed on a glass substrate according to the method of the invention, a crystalline silicon film that is flat and has a highly uniform distribution of crystallinity in the substrate surface.

By forming a number of TFTs by using the crystalline silicon film, the distribution of threshold voltages of the TFTs can be made very uniform in the substrate surface. This effect becomes more remarkable as the substrate area increases.

Where a glass substrate has a size of about 100 mm×100 mm and a thickness of about 1 mm, the convex surface of the stage is such that the height difference of the convex surface between a central portion and end portions (lowest portions) in the area covered by glass substrate is 20 to 200 μm, for instance, about 50 μm.

Where a glass substrate has a size of about 500 mm×500 mm (for instance, 370 mm×400 mm, 400 mm×500 mm, or 550 mm×650 mm) and a thickness of about 0.5 to 0.7 mm, the convex surface of the stage is such that the height difference of the convex surface between a central portion and end portions (lowest portions) in the area covered by glass substrate is about 1 to 2 mm.

If a liquid crystal display is formed by using a glass substrate on which crystalline silicon TFTs for pixels or driving have been formed according to the method of the invention, the cell assembling can be performed easily and positively by virtue of the glass substrate having a very high degree of flatness. In this case, the flattening of a substrate, which is the advantageous effect of the invention, is still effective even if there is no crystallization step with laser light irradiation after the thermal crystallization.

According to the invention, where a glass substrate has a size of 100 mm×100 mm and a thickness of 1.1 mm, the height difference due to surface roughening and undulation of the glass substrate can be made less than about 10 μm.

BRIEF DESCRIPTION OF THE DRAWINGS

FIGS. 12 and 13A to 13C show examples of laser light irradiation methods;

DETAILED DESCRIPTION OF THE PREFERRED EMBODIMENTS

Embodiment 1

This embodiment is directed to a case where laser annealing is performed after an amorphous silicon film formed on a glass substrate is thermally crystallized and TFTs are formed by using a film thus formed.

FIGS. 11A to 11F show a producing process according to this embodiment.

Figure 11A:
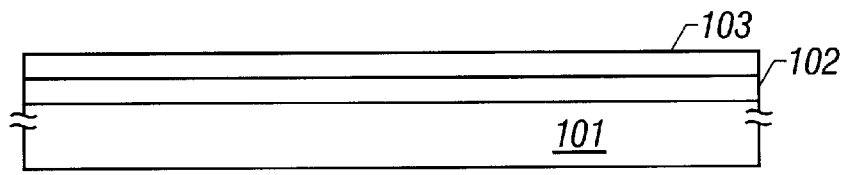
FIGS. 11A–11F show producing processes according to the embodiments of the invention.

A glass substrate 101 is a 100 mm×100 mm, 0.7-mm-thick Corning 1737 glass substrate. Corning 7059, OA2, and NA45 glass substrates and the like may also be used. First, a 2,000-Å-thick under silicon oxide film 102 is formed on the glass substrate 101 by plasma CVD and, immediately thereafter, a 500-Å-thick amorphous silicon film 103 is formed thereon also by plasma CVD. After a 10-ppm nickel acetate aqueous solution is applied to the surface of the amorphous silicon film 103, a nickel acetate layer is formed by spin coating. Better results were obtained by adding a surfactant to the nickel acetate aqueous solution. Since the nickel acetate layer is very thin, it does not always assume a film. But this does not cause any problems in the subsequent steps. (FIG. 11A)

The amorphous silicon film 103 is crystallized by thermal annealing at 550° C. for 4 hours. In this step, nickel serves as nuclei of crystallization, thus accelerating crystallization of the amorphous silicon film 103. The Corning 1737 glass substrate has a strain temperature of 667° C., which is lower than the annealing temperature of 550° C.

When the glass substrate 101 is slowly cooled after the above thermal crystallization, the silicon film contracts and a concave warp occurs in the substrate 101.

It is due to the function of nickel that the thermal annealing can be performed at a low temperature (550° C.; lower than the strain temperature of Corning 1737) and in a short time (4 hours). Detailed are described in Japanese Unexamined Patent Publication No. 6-244104. This publication states that thermal annealing be performed, for instance, at 550° C. for 4 hours so that the thermal annealing temperature does not exceed the strain temperature of a glass substrate. This temperature was determined to prevent large deformation of a glass substrate. Better results were obtained when the concentration of the catalyst element was $1\times10^{15}$ to $1\times10^{19}$ atoms/cm$^3$. When the concentration was higher than $1\times10^{19}$ atoms/cm$^3$, metal properties appeared in silicon, that is, semiconductor characteristics disappeared. In this embodiment, the concentration of the catalyst element in the silicon film was $1\times10^{17}$ to $5\times10^{18}$ atoms/cm$^3$ in terms of a minimum value in the film. That is, these values are minimum values of the concentration of the catalyst element in silicon films as analyzed and measured by secondary ion mass spectrometry (SIMS).

To correct the warp in the glass substrate 101 occurring after the above thermal crystallization step and to have the crystallization further proceed, the glass substrate 23 is forced to assume an inverted-U shape by placing the glass substrate 23 on a stage 22 having an inverted-U-shaped convex surface (see FIG. 12) and bringing the glass substrate 23 into close contact with the stage 22 by proper holding members 24.

In this state, to improve the crystallinity of the crystalline silicon film, a laser beam emitted from an excimer laser, which is a large-output pulsed laser, is applied thereto.

A description will be made of a laser annealing apparatus used in this embodiment.

Figure 6:
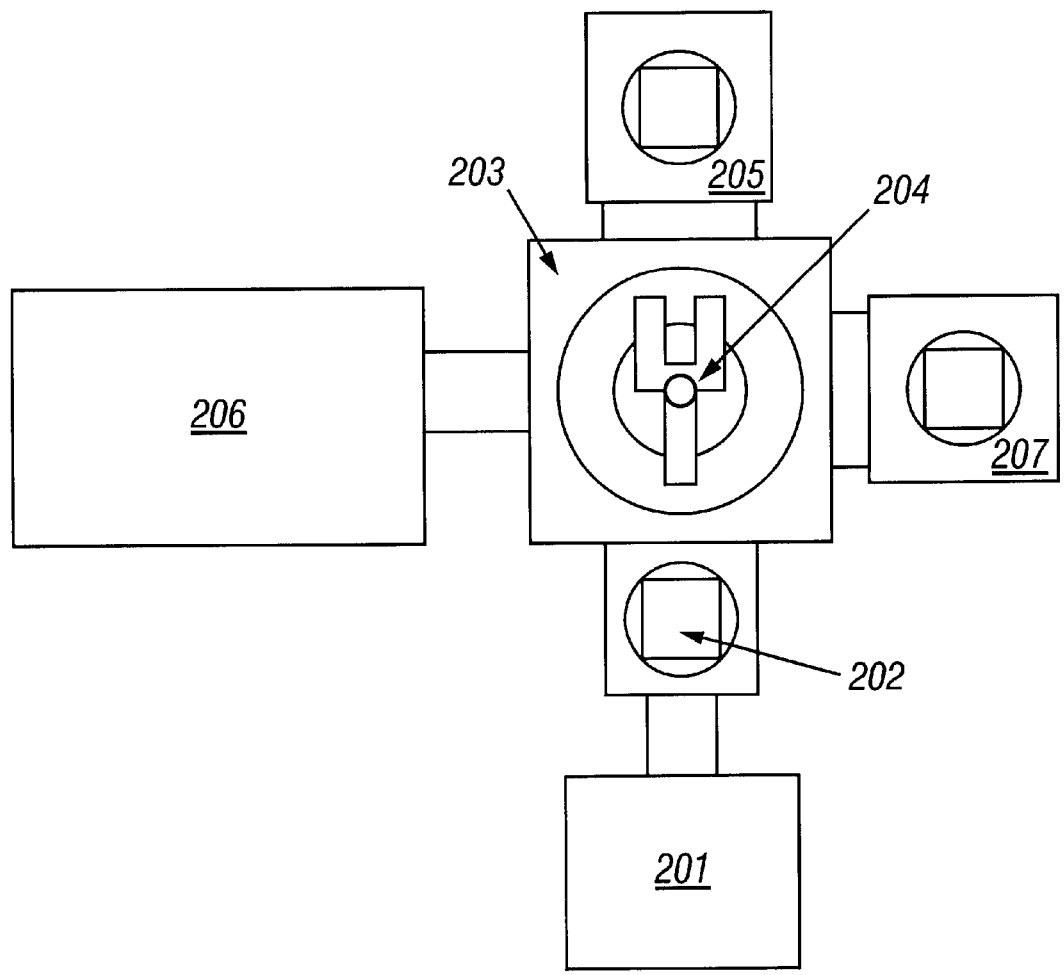
FIG. 6 shows the concept of a laser annealing apparatus used in embodiments of the invention.

FIG. 6 shows the laser annealing apparatus, used in this embodiment, of a multi-chamber type. A substrate is placed through a loader/unloader chamber 201, and then properly positioned in an alignment chamber 202. The substrate is consecutively transferred to the respective chambers through a transfer chamber 203 by a substrate transfer robot 204 provided in the transfer chamber 203, and processed in those chambers.

A substrate is transferred to a heat treatment chamber 205, where it is subjected to a heat treatment such as preliminary heating. Then, the substrate is subjected to laser annealing in a laser annealing chamber 206, slowly cooled in a cooling chamber 207, and moved to a loader/unloader chamber 201.

In the laser annealing apparatus concerned, the energy variation among laser pulses falls within ±3% in terms of 3σ. Although a pulsed laser having a larger energy variation than the above range may be used, the depth of focus is narrow in such a case. A pulsed laser whose energy variation is larger than ±10% in terms of 3σ is not suitable for use in this embodiment.

Type EX748 produced by Lumnics Corp. is used as an oscillator. This oscillator emits KrF excimer laser light (wavelength: 248 nm; pulse width: 25 ns). Naturally other excimer lasers and other types of lasers may be used as long as they are of a pulsed oscillation type.

Being airtight, this laser annealing apparatus is free of impurity contamination. This laser annealing apparatus has an atmosphere control function. Further, having a substrate heating function, this laser annealing apparatus can keep an irradiation object at a desired temperature during laser light irradiation.

To deform the shape of an emitted laser beam, it is introduced into an optical system as shown in FIG. 7.

A laser beam assuming a rectangle of about 3 cm×2 cm immediately before entering the optical system is shaped by the optical system into a long and narrow beam (i.e., linear beam) of 10 to 30 cm in length and 0.01 to 0.3 cm in width.

Figure 1:
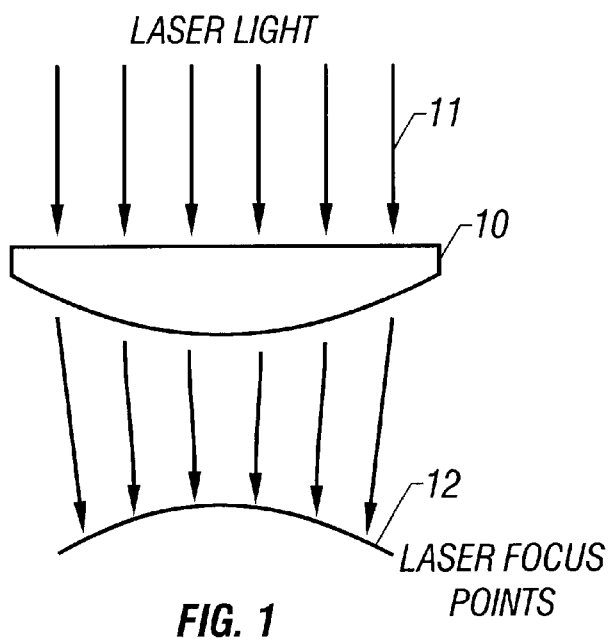
FIG. 1 shows an example of a linear laser beam having an inverted-U-shaped focus line.
Figure 15A:
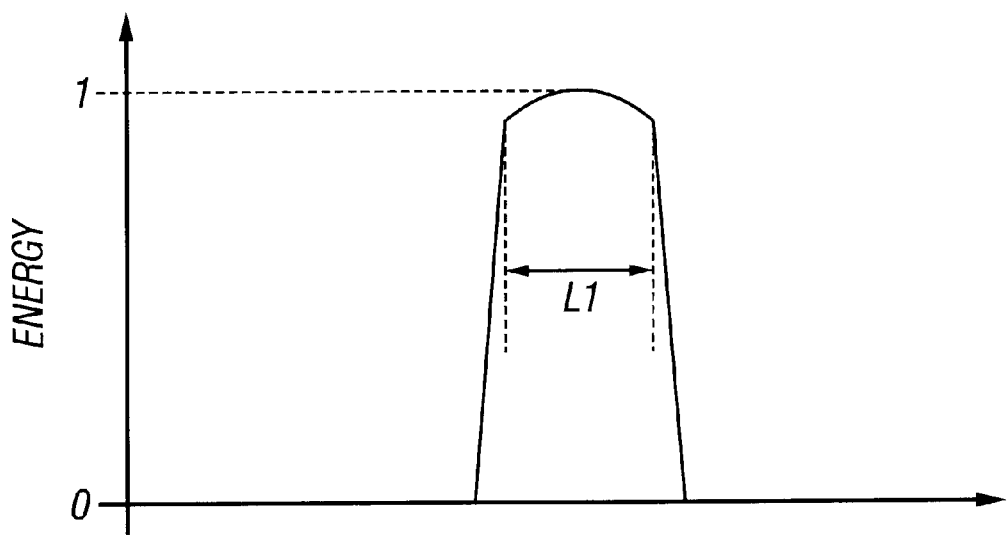
FIGS. 15A and 15B show laser beam energy density profiles.
Figure 15B:
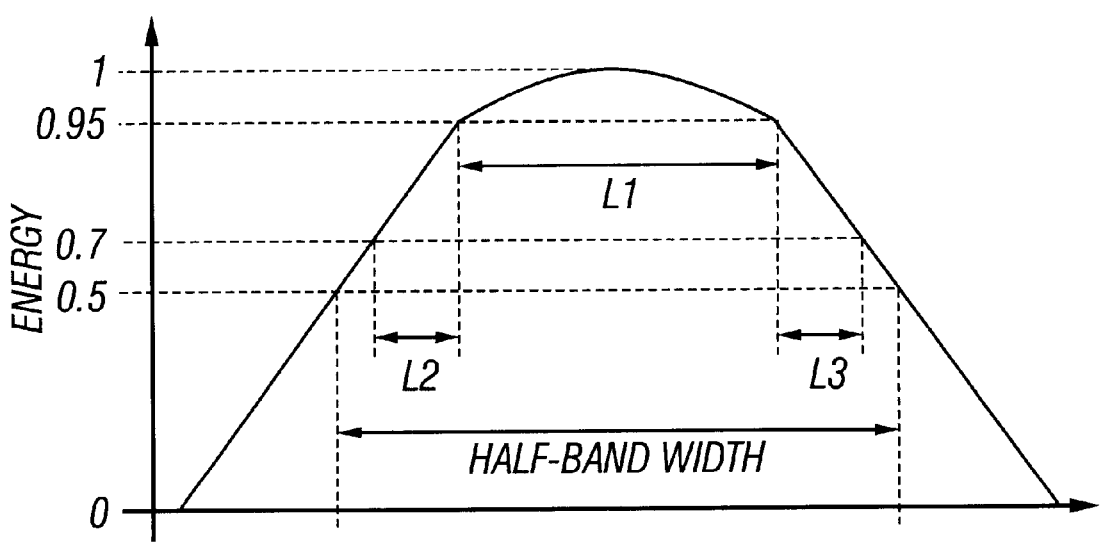

After passing through the optical system, the linear laser beam has a focus distribution as shown in FIG. 1, and assumes a trapezoidal energy density profile as shown in FIG. 15B in the width direction. After passing through the optical system, the linear laser beam has a maximum energy of 800 mJ/shot.

The reason for shaping an emitted laser beam into a long and narrow beam is to improve its workability. That is, if a linear laser beam is longer than the width of a sample, the entire sample can be irradiated by moving the sample in one direction. Even if the linear laser beam is shorter than the width of a sample, the laser processing is completed in a shorter time than in the case of using a rectangular beam. However, in this case, the beam needs to be moved relative to the sample in the two orthogonal directions.

A stage of a substrate (i.e., sample) to be irradiated with a laser beam is controlled by a computer, and is so designed as to be movable perpendicularly to the longitudinal direction of the linear laser beam. If the stage is further provided with a function of moving it in the longitudinal direction of a linear beam, the entire sample can be subjected to laser processing even if the beam is shorter than the width of a sample.

Figure 14:
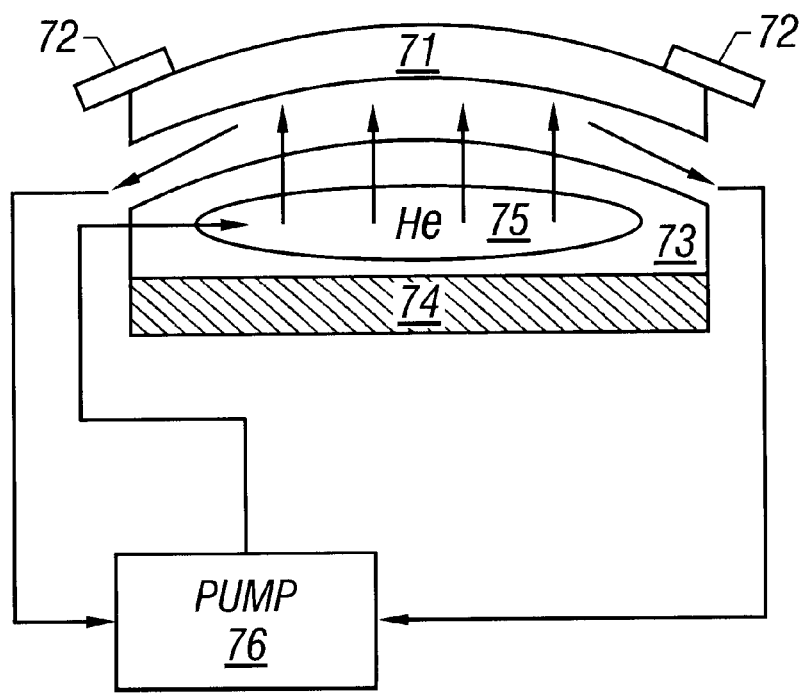
FIG. 14 shows an example of a substrate heating method.

The stage 73 has a structure shown in FIG. 14. A sample can be kept at a given temperature during laser light irradiation while being heated by means of a He gas 75.

Figure 7A:
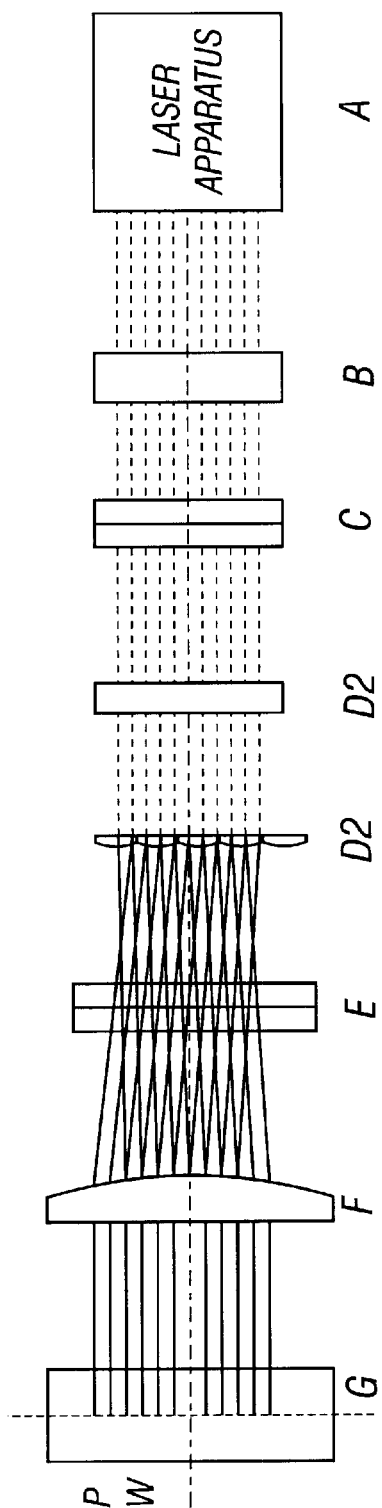
FIGS. 7A to 7C and 8A and 8B show examples of optical systems used in the embodiments of the invention.
Figure 7B:
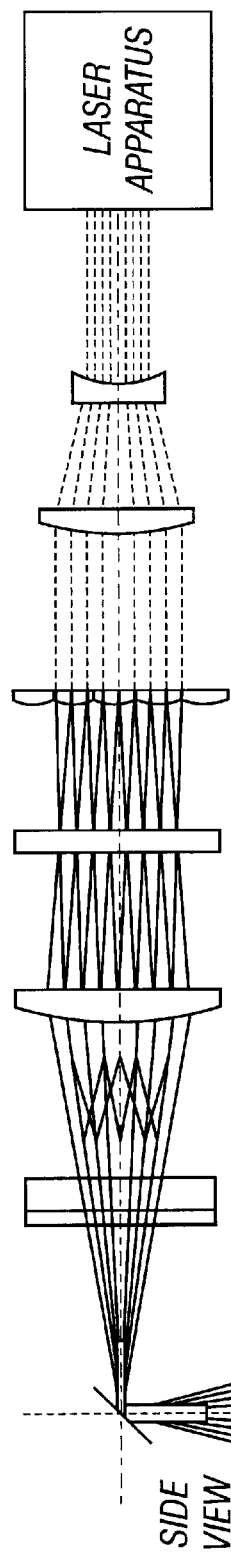

Referring to FIGS. 7A and 7B, a description will be made of an optical path in the optical system for shaping a laser beam into a linear beam.

An incident laser beam passes through a cylindrical concave lens B, a cylindrical convex lens C (the lenses B and C are together called a beam expander), and fly-eye lenses D and D2.

The laser beam is then passed through a cylindrical convex lens E (first cylindrical lens) and a cylindrical convex lens F (second cylindrical lens) that is provided to improve the uniformity of the beam in the longitudinal direction, reflected by a mirror G, converged by a cylindrical lens H, and finally applied to the irradiation surface.

The distances (each being the sum of the focal lengths of the respective lenses concerned) between the cylindrical lenses A and B, between the fly-eye lenses D and D2, between the fly-eye lens D and the cylindrical lens E, and between the cylindrical lens F and the irradiation surface are set at 230 mm, 230 mm, 650 mm, and 650 mm, respectively. Apparently these values can be changed as occasion demands.

Figure 9:
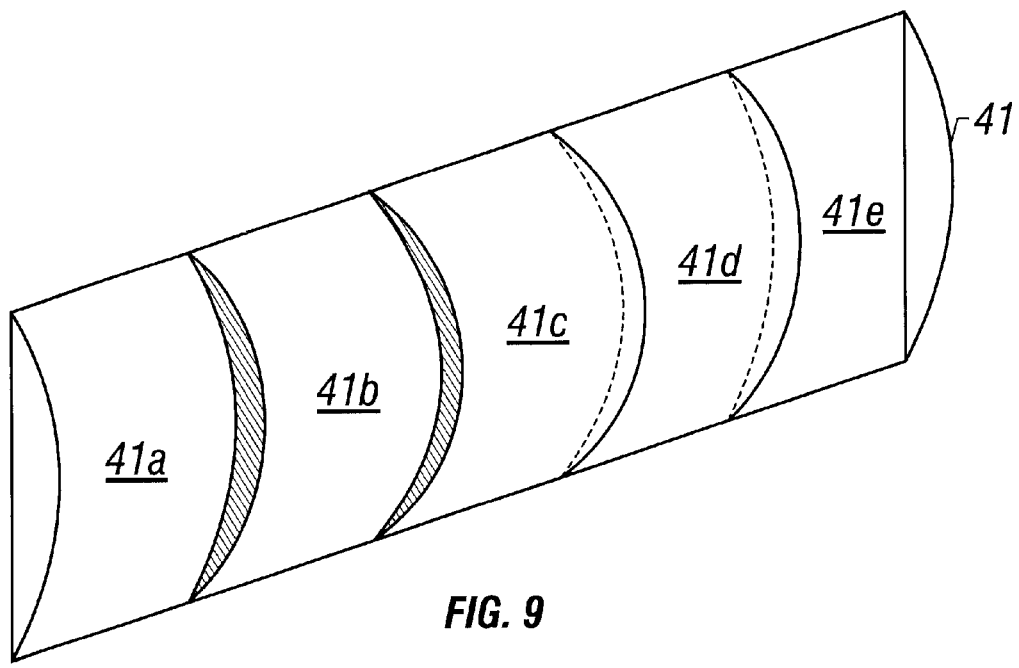
FIGS. 9 and 10 show examples of cylindrical lenses having different focal lengths in the longitudinal direction.
Figure 10:
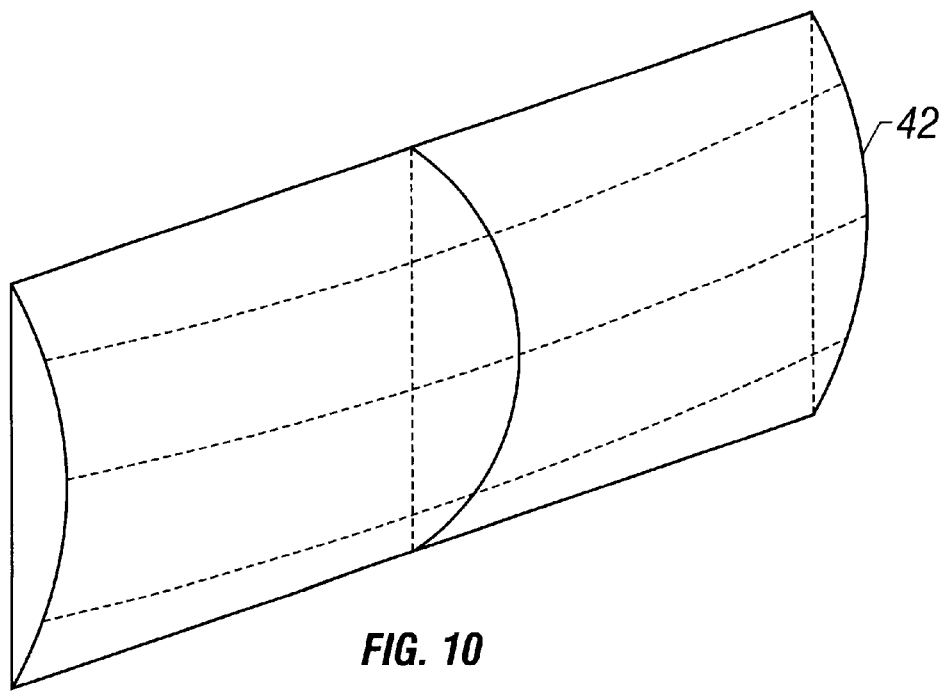

The cylindrical lens H has a focal length of 120 mm. In a structure as shown in FIG. 9 or 10, the cylindrical lens H forms an inverted-U-shaped focus line on the irradiation surface.

Any optical system may be employed as long as it can shape a laser beam into a linear beam as required in the invention. For example, it is effective to use an optical system shown in FIG. 8 which is not provided with the lenses B and C.

A laser beam is shaped into a linear beam so as to have a beam area of 125 mm×1 mm at the irradiation position. The width of a laser beam is defined as a half width of the maximum value of its energy density.

Figure 7C:
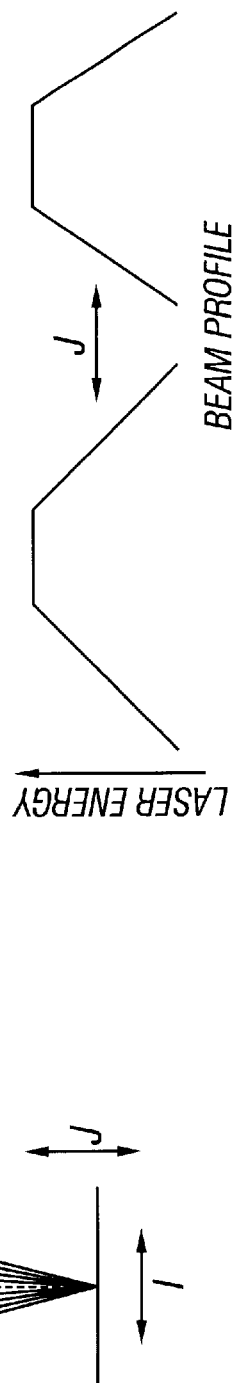

The shape of the energy density profile of a laser beam at the focus is adjusted to be trapezoidal by moving the lens H vertically (in direction J) (FIG. 7C). Alternatively, the energy density profile of a laser beam on the irradiation surface (i.e, at the focus) can be changed from a shape close to a rectangle to a shape close to a trapezoid by moving the irradiation surface vertically (in direction J) with respect to the lens H.

Referring to FIG. 15B, the energy density profile in the width direction of a linear laser beam is trapezoidal in which L1=0.4 mm and L2=L3=0.25 mm, which satisfy inequalities $0.5L1 \leq L2 \leq L1$ and $0.5L1 \leq L3 \leq L1$. In this case, the depth of focus is about ±400 mm.

Figure 16A:
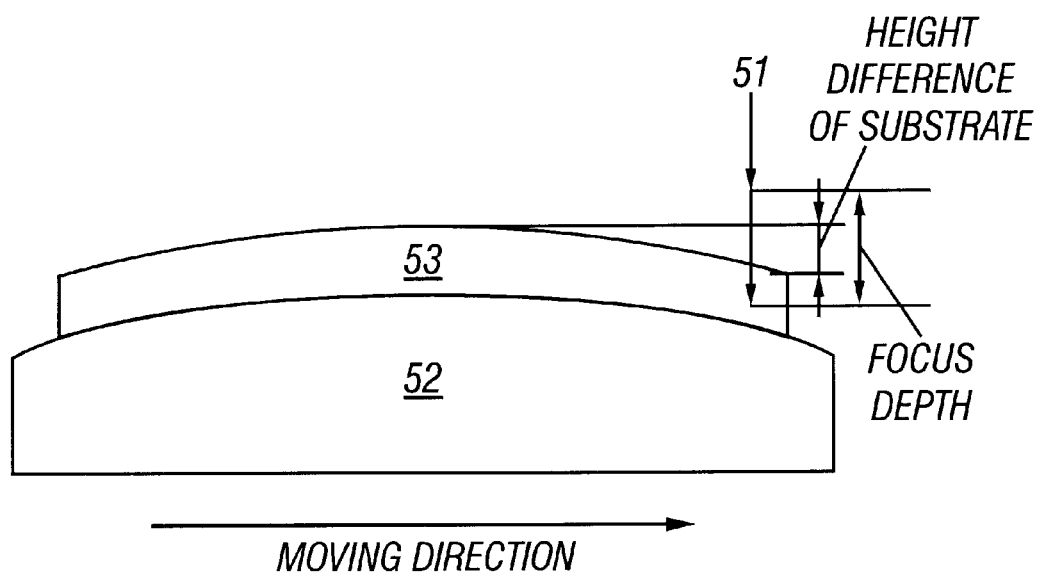
FIGS. 16A and 16B show an example of a laser light irradiation method in a case where a linear laser beam has a trapezoidal energy density profile.
Figure 16B:
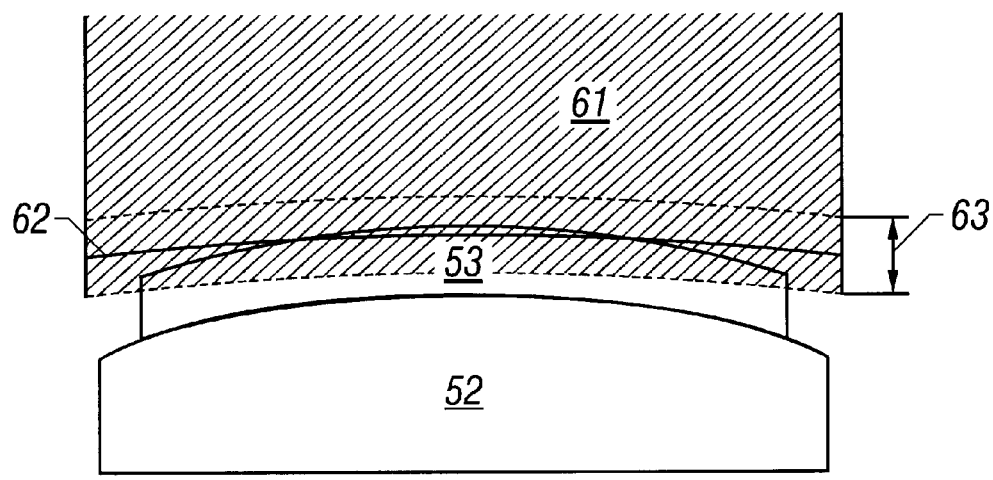

As for the laser light irradiation method, as shown in FIG. 16A, irradiation is performed such that a linear laser beam 51 is moved relative to an irradiation object by moving a stage 52 having a convex surface on which a glass substrate 53 is placed only horizontally (in direction I in FIG. 7B).

The linear beam 51 is relatively moved approximately perpendicularly to its longitudinal direction so that an inverted-U-shaped focus line of the laser beam is always located in the surface of the glass substrate 53.

The irradiation surface of the substrate 53 is a convex surface that conforms to the shape of the stage 52, and has a height difference of about 300 μm also in the movement direction of the substrate 53. As shown in FIGS. 13A to 13C, the laser light irradiation may be performed while the height (in direction J in FIG. 7B) of a stage 33 on which a substrate 32 is placed is also changed in accordance with the height difference of the convex surface.

The degree of expanse of the bottom portion of the above trapezoidal profile varies with the distance between the final lens of the optical system and the irradiation surface. During the laser processing, the distance between the final lens of the optical system and the irradiation surface varies due to asperities of an irradiation object, and the degree of expanse of the bottom portion of the laser beam trapezoidal profile varies accordingly. However, if the variation range is such that the above inequalities are satisfied, uniform laser processing is assured. The term "uniform" as used herein means that a mobility variation in the substrate surface of a film that has been irradiated with laser light falls within ±10%.

A sample is placed on the stage, and the irradiation is performed while the stage is moved at 2 mm/s. As for the laser light irradiation conditions, the laser light energy density is 100 to 500 mJ/cm$^2$ (300 mJ/cm$^2$ in this embodiment) and the pulse rate is 30 pulses/s. The term "energy density" as used herein means the density of the top base portion (having a maximum value) of a trapezoidal beam profile.

Figure 17:
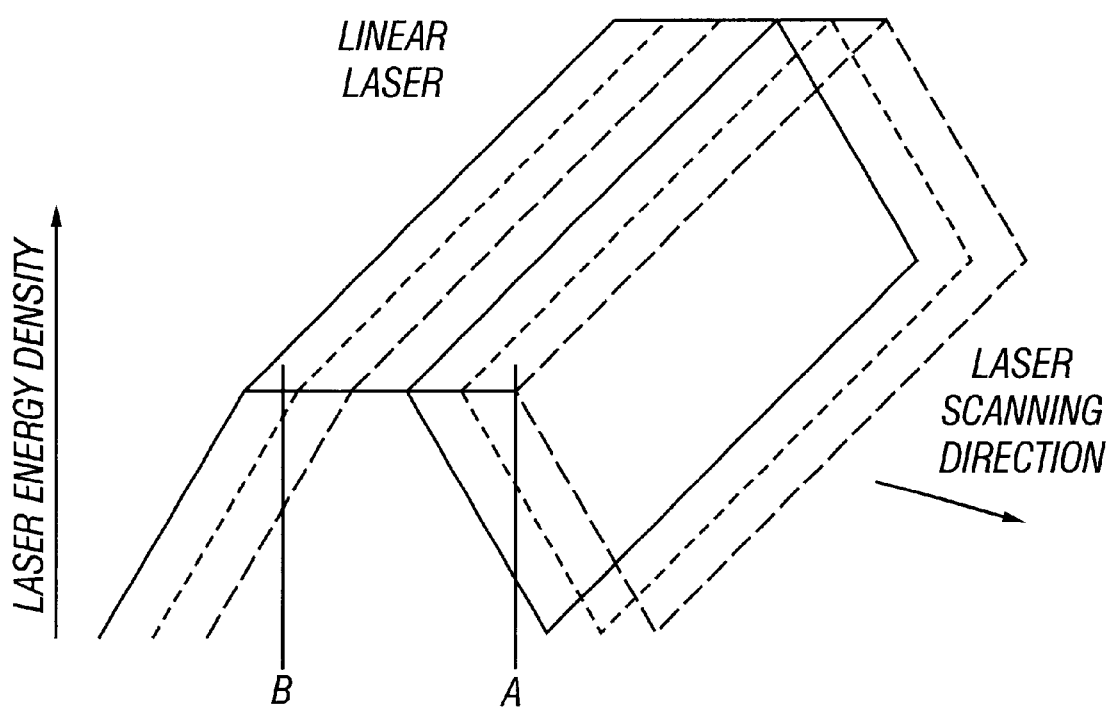
FIG. 17 shows how laser light irradiation is performed with a linear laser beam having a trapezoidal energy density profile.

If the laser light irradiation is performed under the above conditions, a certain point of the sample is subjected to 15-step irradiation. That is, since pulse beams take 0.5 second to pass one point of the sample, the one point is irradiated with 15 pulse beams in each scan. Of the 15 times of irradiation, the irradiation energy density gradually increases in first several times of irradiation and gradually decreases in last several times of irradiation. FIG. 17 shows how the irradiation is effected. The laser beam energy density gradually increases in the head portion of the 15 steps (indicated by A) and gradually decreases in the end portion (indicated by B).

This type of laser light irradiation can provide superior crystallinity with low degrees of surface roughness and accumulation of internal stress which crystallinity is equivalent to that obtained by the conventional two-step irradiation, without using a plurality of laser beams having different energy densities.

According to an experiment by the inventors, 3 to 100 steps of irradiation, preferably 10 to 40 steps of irradiation, provided silicon films with the best crystallinity.

Figure 11B:
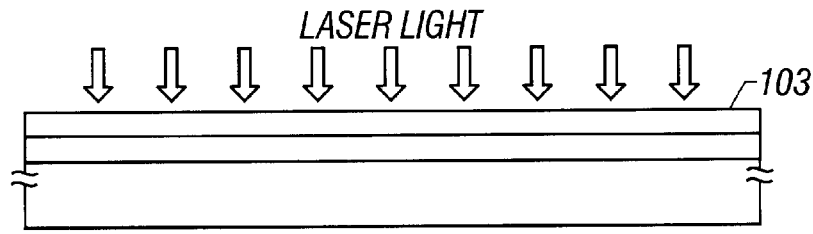

During the laser light irradiation, the substrate temperature is from a temperature higher than the room temperature to about 70% of the strain temperature of the glass substrate. In this embodiment, it is 200° C. (FIG. 11B)

When the glass substrate is slowly cooled after completion of the above step, the silicon film that is formed on the substrate contracts more than the substrate. As a result, the glass substrate assumes a very high degree of flatness.

Then, TFTs as semiconductor devices are formed by using the crystalline silicon film obtained above. The TFTs are formed on the substrate in matrix form. Specifically, 400× 300 TFTs are formed in the area of 40 mm×50 mm. A producing process will be described below.

Figure 11C:
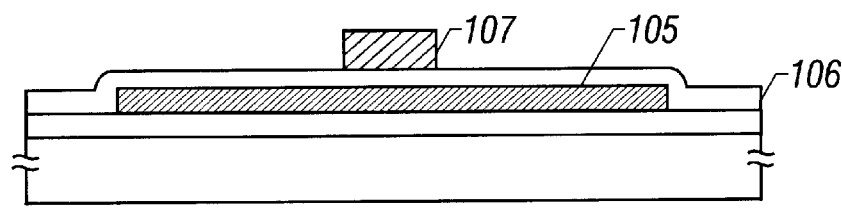

The silicon film is etched into an island-like silicon region 105. A 1,200-Å-thick silicon oxide film 106 as a gate insulating film is then deposited by plasma CVD by using material gases of TEOS and oxygen. During the film deposition, the substrate temperature is kept at 250 to 380° C., for example, 300° C. (FIG. 11C)

Subsequently, an aluminum film (containing silicon at 0.1 to 2%) having a thickness of 3,000 to 8,000 Å, for example, 6,000 Å, is deposited by sputtering. A gate electrode 107 is formed by etching the aluminum film. (FIG. 11C)

Figure 11D:
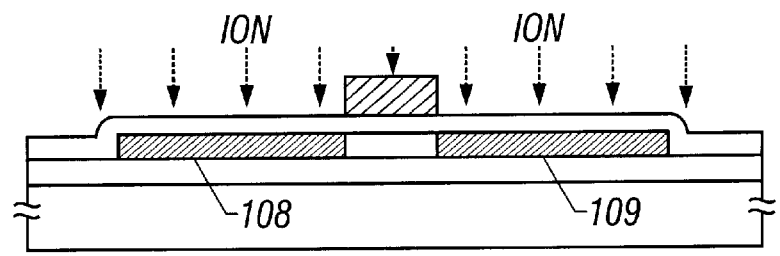

An impurity (boron) is implanted into the silicon region 105 by ion doping with the gate electrode 107 used as a mask. Diborane ($B_2H_2$) diluted with hydrogen to 1 to 10%, for instance, 5%, is used as a doping gas. The acceleration voltage is 60 to 90 kV, for instance, 65 kV, and the dose is $2\times10^{15}$ to $5\times10^{15}$ atoms/cm$^2$, for instance, $3\times10^{15}$ atoms/cm$^2$. During the ion doping, the substrate temperature is the room temperature. As a result, P-type impurity regions 108 (source) and 109 (drain) are formed. (FIG. 11D)

Figure 11E:
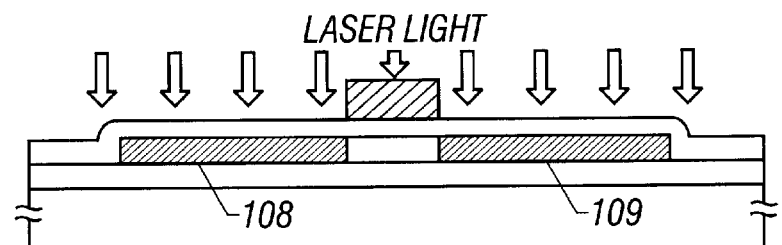

To activate boron thus implanted, optical annealing is performed by using KrF excimer laser light. The energy density of laser light is 100 to 350 mJ/cm$^2$, for instance, 250 mJ/cm$^2$. Crystallinity is improved by preliminary irradiation at an energy density of about 170 mJ/cm$^2$ before the above irradiation. As for the laser light irradiation method, a linear laser beam is applied to the irradiation object while the former is moved relative to the latter approximately perpendicularly to the longitudinal direction of the linear laser beam. Setting is so made that an arbitrary point of the irradiation object is irradiated with 2 to 20 shots of laser beams. During the laser light irradiation, the substrate temperature is 200° C. Thereafter, thermal annealing is performed at 450° C. for 2 hours in a nitrogen atmosphere. (FIG. 11E)

Figure 11F:
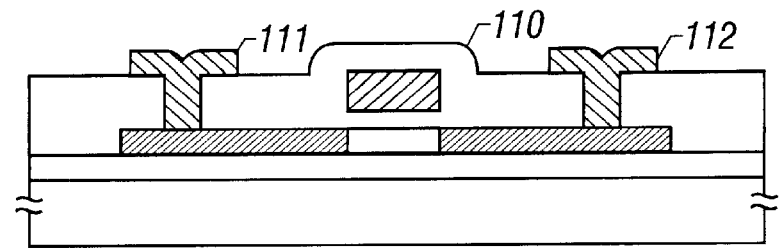

A 6,000-Å-thick silicon oxide film 110 as an interlayer insulating film is formed by plasma CVD, and contact holes are formed through it. Source/drain electrodes/wiring lines 111 and 112 of the TFT are formed with a metal film, for instance, a multi-layer film of titanium and aluminum. Thermal annealing is performed at 200 to 350° C. in a hydrogen atmosphere of 1 atm. (FIG. 11F)

Figure 2:
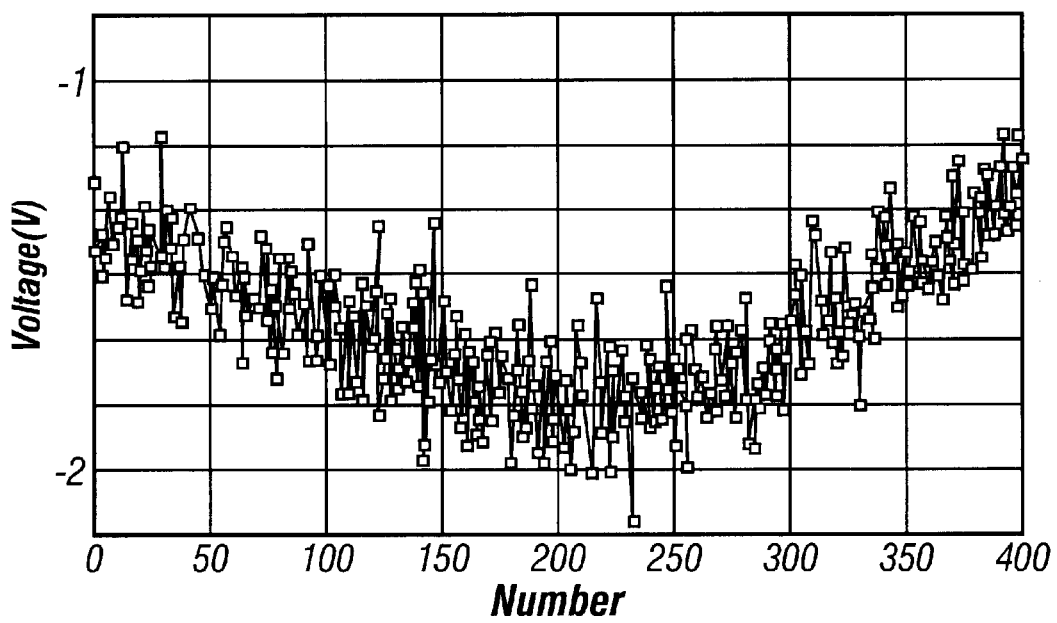
FIG. 2 shows a distribution, in the substrate surface, of threshold voltages of TFTs formed by using a crystalline silicon film according to a conventional method.
Figure 3:
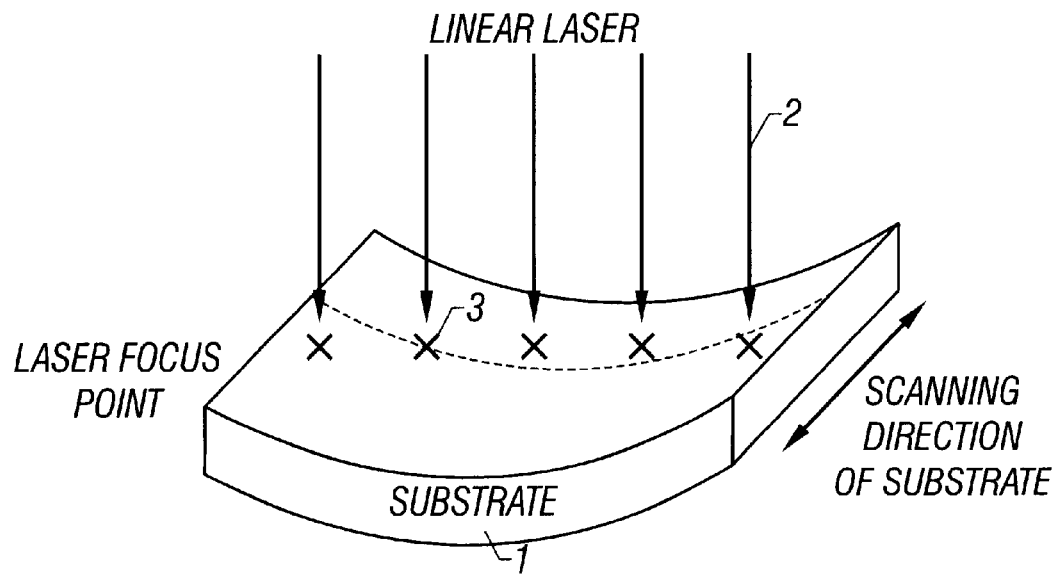
FIG. 3 shows how laser annealing is performed with linear laser light on a silicon substrate formed on a glass substrate having a warp.
Figure 4:
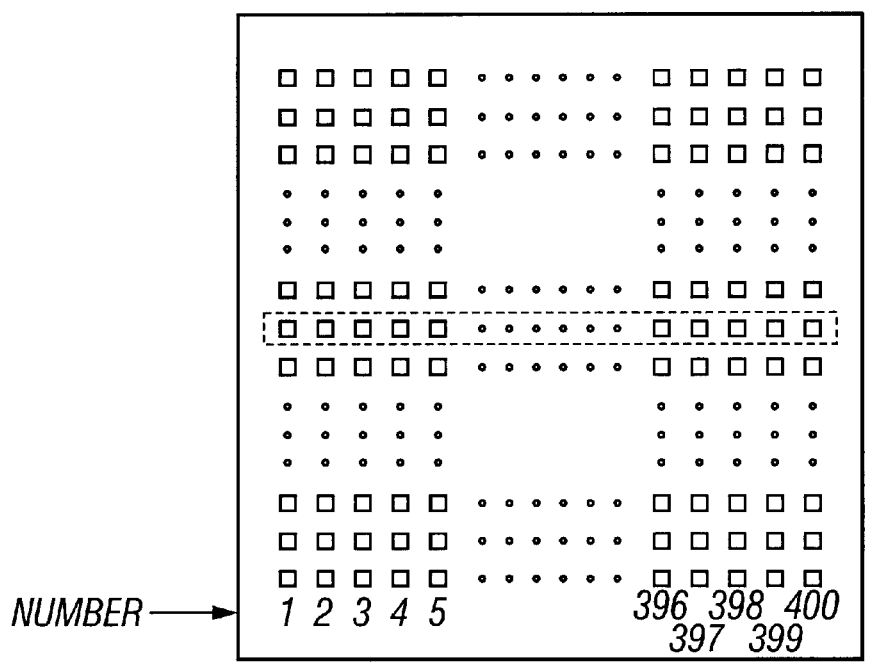
FIG. 4 shows an arrangement of TFTs on a glass substrate.
Figure 5:
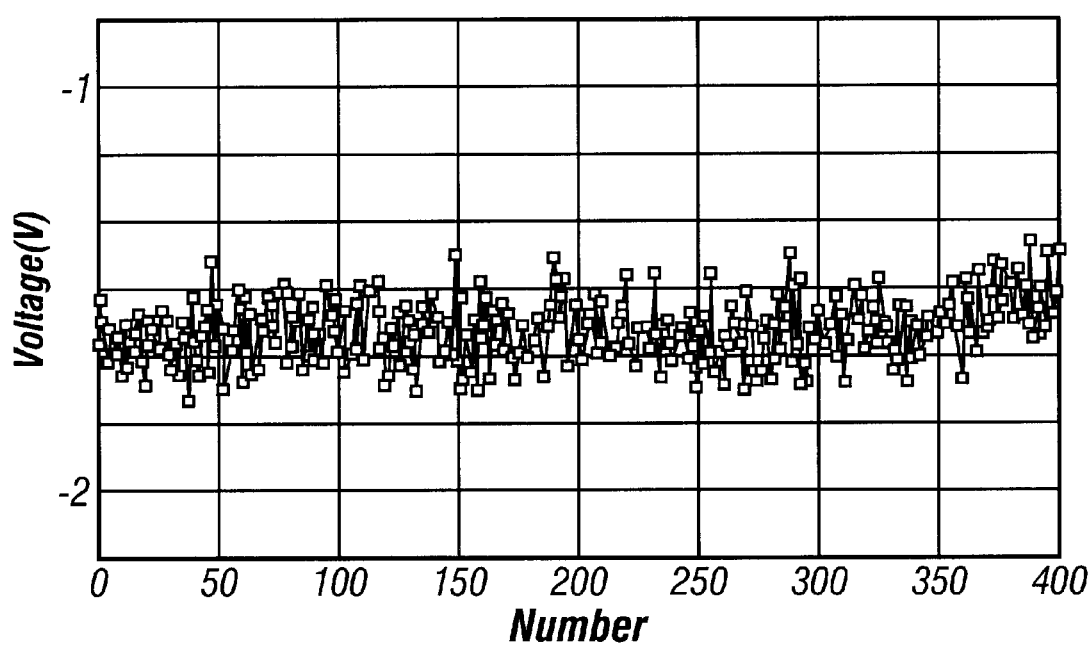
FIG. 5 shows a distribution, in the substrate surface, of threshold voltages of TFTs formed by using a crystalline silicon film that was formed according to a first embodiment of the present invention.

FIG. 5 shows a distribution, in the substrate surface, of threshold voltages of TFTs using the crystalline silicon film formed according to this embodiment. In FIG. 5, as in the case of FIG. 2, the horizontal axis represents the positions of the respective TFTs shown in FIG. 4 (enclosed by a broken line).

As seen from FIG. 5, the TFTs that were produced according to this embodiment have a uniform distribution of threshold voltage in the substrate surface. It is apparent that the distribution of FIG. 5 is higher in the degree of uniformity than the conventional distribution of FIG. 2.

In this embodiment, the irradiation object has a convex surface with a height difference of about 300 µm. Although the substrate is moved only in the horizontal direction, the depth of focus of a laser beam is about ±400 µm. Therefore, the mobility variation, in the substrate surface, of the crystallized coating was about ±8%, which means that the laser processing was conducted uniformly.

Another experiment was conducted in which the energy density profile of a linear laser beam in the width direction was set such that L1=0.5 mm and L2=L3=0.2 mm, which satisfy 0.5L1>L2=L3 (see FIG. 15B) and means a profile somewhat closer to a rectangle, and laser annealing was performed on a similar irradiation object (i.e., silicon film). In this case, the mobility variation was ±15%.

A further experiment was conducted in which the energy density profile of a linear laser beam in the width direction was set such that L1=0.2 mm and L2=L3=0.3 mm, which satisfy L1<L2=L3 (see FIG. 15B) and means a profile somewhat closer to a triangle, and laser annealing was performed on a similar irradiation object (i.e., silicon film). In this case, although the mobility variation was ±8%, the mobility values were very small for a crystalline silicon film.

Embodiment 2

This embodiment is directed to a case where an amorphous silicon film formed on a glass substrate is crystallized by laser annealing and TFTs are formed by using a film thus formed.

A producing process according to this embodiment will be described with reference to FIGS. 11A to 11F, which were also used above in the description of the first embodiment.

A glass substrate 101 is a 100 mm×100 mm, 0.7-mm-thick Corning 1737 glass substrate. Corning 7059, OA2, and NA45 glass substrates and the like may also be used. First, a 2,000-Å-thick undercoat silicon oxide film 102 is formed on the glass substrate 101 by plasma CVD and, immediately thereafter, a 500-Å-thick amorphous silicon film 103 is formed thereon also by plasma CVD.

The following is performed not only to crystallize the amorphous silicon film 103 formed on the glass substrate 101 but also to suppress substrate deformation by the crystallization.

The glass substrate 71 is placed on a stage 73 having an inverted-U-shaped convex surface (see FIG. 14) and brought into close contact with the stage 73 by proper holding members 72. Further, the glass substrate 71 is heated to a temperature within the range from a temperature higher than the room temperature to about 70% of the strain temperature of the glass substrate 71. In this embodiment, the glass substrate 71 is heated to 200° C.

As for the heating method, the heating can be performed efficiently by using a helium gas as shown in FIG. 14.

To crystallize the amorphous silicon film 103, laser annealing is performed by irradiating it with laser light emitted from an excimer laser, which is a large-output pulsed laser. As in the case of the first embodiment, the laser annealing apparatus of FIG. 6 is used in this embodiment.

In this embodiment, type 3000-308 produced by Lambda Physic Corp. is used as an oscillator. This oscillator emits XeCl excimer laser light (wavelength: 308 nm; pulse width: 26 nsec).

To deform the shape of an emitted laser beam, it is introduced into an optical system as shown in FIG. 8.

A laser beam assuming a rectangle of about 3 cm×2 cm immediately before entering the optical system is shaped by the optical system into a long and narrow beam (i.e., linear beam) of 10 to 30 cm in length and 0.01 to 0.3 cm in width.

After passing through the optical system, the linear laser beam assumes a rectangular energy density profile as shown in FIG. 15A in the width direction, and has a focus distribution as shown in FIG. 1 in the longitudinal direction. After passing through the optical system, the linear laser beam has a maximum energy of 1,000 mJ/shot.

Figure 8A:
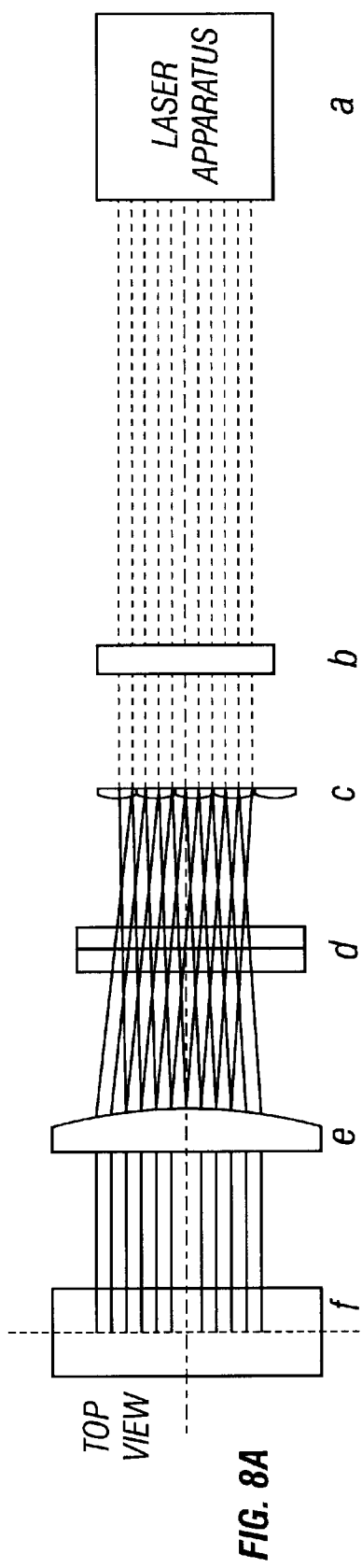
Figure 8B:
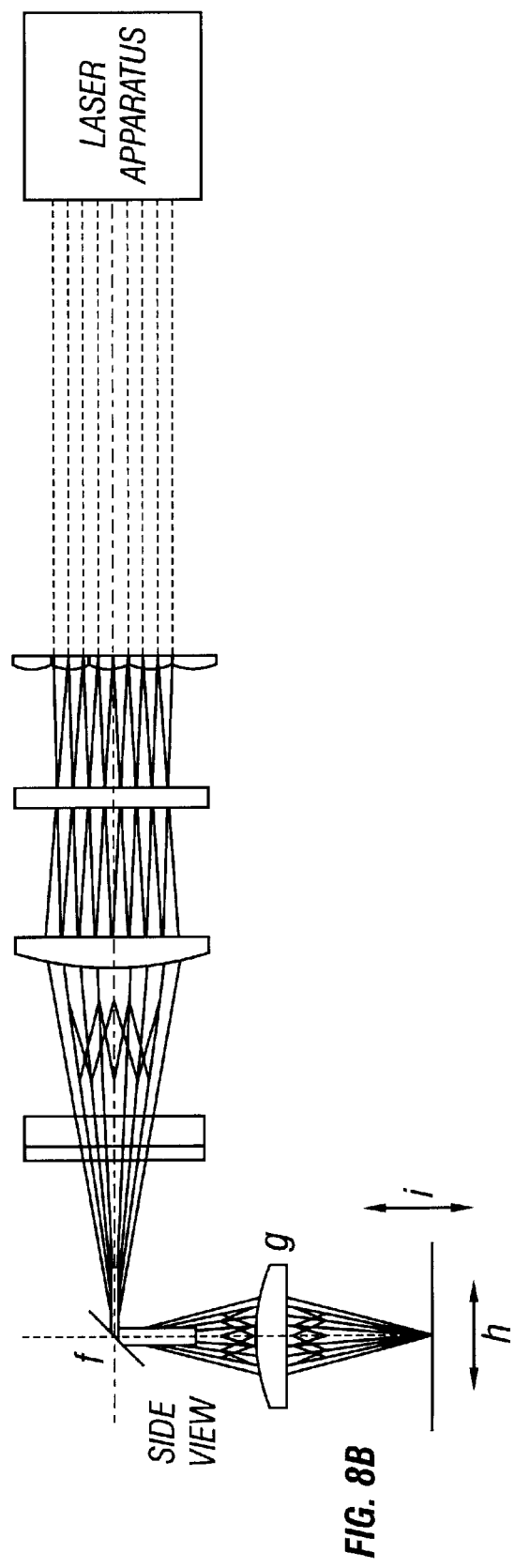

Referring to FIGS. 8A and 8B, a description will be made of an optical path in the optical system for shaping a laser beam into a linear beam.

A laser beam emitted from a laser light source a and input to the optical system passes through fly-eye lenses b and c.

The laser beam is then passed through a cylindrical convex lens d (first cylindrical lens) and a cylindrical convex lens e (second cylindrical lens) that is provided to improve the uniformity of the beam in the longitudinal direction, reflected by a mirror f, converged by a cylindrical lens g, and finally applied to the sample.

As for the optical path lengths, the distance between the laser light source a to the mirror g is 2,000 mm and the distance between the mirror f and the irradiation surface is 440 mm. The cylindrical lens g has a focal length of about 100 mm.

A laser beam is shaped into a linear beam so as to have a beam area of 300 mm×0.4 mm at the irradiation position. The width of a laser beam is defined as a half width of its irradiation energy density.

Figure 12:
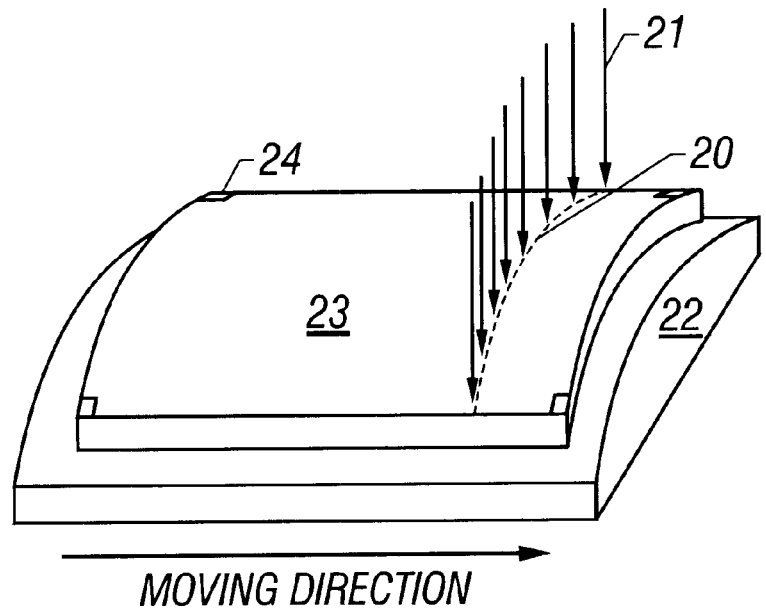

As for the laser light irradiation method, the irradiation is performed while the linear laser beam is moved relative to the irradiation object as shown in FIG. 12. The linear laser beam (or the substrate) is moved approximately perpendicularly to its longitudinal direction (direction h in FIG. 8B).

The laser light irradiation is performed such that an inverted-U-shaped focus line of the laser beam is always located in the curved surface of the glass substrate surface. The substrate is so curved as to assume a clear inverted-U shape, and the height difference in the substrate movement direction is much smaller than in the curving direction (longitudinal direction of the laser beam).

The energy density of laser light is 100 to 500 mJ/cm$^2$, for instance, 370 mJ/cm$^2$. Crystallinity is improved by preliminary irradiation at an energy density of about 220 mJ/cm$^2$ before the above irradiation. An arbitrary point on the irradiation surface is irradiated with 2 to 20 shots of laser beams.

During the laser light irradiation, the substrate temperature is from a temperature higher than the room temperature to about 70% of the strain temperature of the glass substrate. In this embodiment, the substrate temperature is 200° C. (FIG. 11B)

When the glass substrate is slowly cooled after completion of the above step, the silicon film that is formed on the substrate contracts more than the substrate. As a result, the glass substrate assumes a very high degree of flatness.

Thereafter, TFTs are formed in the same manner as in the first embodiment.

As in the case of the first embodiment, the distribution, in the substrate surface, of threshold voltages of the TFTs thus produced was much higher in the degree of uniformity than that of TFTs that were produced without flattening a glass substrate.

Embodiment 3

As in the case of the second embodiment, this embodiment is directed to a case where an amorphous silicon film formed on a glass substrate is crystallized by laser annealing and TFTs are formed by using a film thus formed, and the glass substrate is placed on a stage having a convex surface.

A producing process according to this embodiment will be described with reference to FIGS. 11A–11F, which were also used above in the description of the first embodiment.

A glass substrate 101 is a 100 mm×100 mm, 0.7-mm-thick Corning 1737 glass substrate. Corning 7059, OA2, and NA45 glass substrates and the like may also be used. A 2,000-Å-thick under silicon oxide film 102 is formed on the glass substrate 101 by plasma CVD and, immediately thereafter, a 500-Å-thick amorphous silicon film 103 is formed thereon also by plasma CVD.

The following step is performed not only to crystallize the amorphous silicon film 103 formed on the glass substrate 101 but also to suppress substrate deformation by the crystallization.

The glass substrate 101 is placed on a stage having a convex surface and brought into close contact with the stage by proper holding members. The glass substrate 101 is heated at a temperature range from a temperature higher than the room temperature to about 70% of the strain temperature of the glass substrate 101. In this embodiment, the glass substrate 101 is heated to 200° C.

As for the heating method, the heating can be performed efficiently by using a helium gas as shown in FIG. 14.

To crystallize the amorphous silicon film 103, laser annealing is performed by irradiating it with laser light emitted from an excimer laser, which is a large-output pulsed laser. As in the case of the first embodiment, the laser annealing apparatus of FIG. 6 is used in this embodiment.

In this embodiment, the oscillator, the optical system, the laser beam shape, and the focus line are the same as those in the second embodiment.

The energy density profile of a linear laser beam in the width direction is rectangular as shown in FIG. 15A.

As for the laser light irradiation method, the irradiation is performed while the linear laser beam is moved relative to the irradiation object as shown in FIG. 13. The linear laser beam (or the substrate) is moved approximately perpendicularly to its longitudinal direction (direction h in FIG. 8B).

The glass substrate 101 has a height difference also in the substrate movement direction. However, since the energy density profile of the linear laser beam in the width direction is rectangular, the depth of focus is not wide. In view of this, the stage on which the substrate 101 is placed is moved in the height direction (direction i in FIG. 8B) as shown in parts FIGS. 13A to 13C so that the inverted-U-shaped focus line of the laser beam is located in the surface of the glass substrate 101.

The energy density of laser light is 100 to 500 mJ/cm$^2$, for instance, 370 mJ/cm$^2$. Crystallinity is improved by preliminary irradiation at an energy density of about 220 mJ/cm$^2$ before the above irradiation. An arbitrary point of the irradiation object is irradiated with 2 to 20 shots of laser beams.

During the laser light irradiation, the substrate temperature is from a temperature higher than the room temperature to about 70% of the strain temperature of the glass substrate. In this embodiment, the substrate temperature is 200° C. (FIG. 11B)

When the glass substrate is slowly cooled after completion of the above step, the silicon film that is formed on the substrate contracts more than the substrate. As a result, the glass substrate assumes a very high degree of flatness.

Thereafter, TFTs are formed in the same manner as in the first embodiment.

As in the case of the first embodiment, the distribution, in the substrate surface, of threshold voltages of the TFTs thus produced was much higher in the degree of uniformity than that of TFTs that were produced without flattening a glass substrate.

According to the invention, a glass substrate on which a crystalline silicon film is formed is flattened, whereby a crystalline silicon film whose crystallinity is high and uniform in the substrate surface can be obtained even after a laser light irradiation step.

By using such a crystalline silicon film, crystalline silicon TFTs having a uniform distribution of threshold voltages in the substrate surface can be produced.

The invention is particularly advantageous in forming a large number of TFTs on a large-area glass substrate.

In producing a liquid crystal display by using a glass substrate according to the invention, the cell assembling can be performed easily and positively because the substrate is flat. As such, the invention is very useful from the industrial viewpoint.

What is claimed is:

1. A method for treating a semiconductor film with a laser light comprising:

producing linear laser pulses each having an energy density profile gradually increasing and continuing a flat top base portion thereof and gradually decreasing; and irradiating said linear laser pulses to said semiconductor film while moving said linear laser pulses relatively with respect to said semiconductor film in a direction perpendicular to a longitudinal direction of said linear laser pulses to vary energy densities of said linear laser pulses at a point of said semiconductor film in a manner of gradually increasing and subsequently continuing said flat top base portion and subsequently gradually decreasing, wherein a linear laser pulses have a focus line that extends along a longitudinal direction of said linear laser pulses and coincide with a sectional shape of a surface of said semiconductor film.

2. The method of claim 1 wherein said energy density profile is a trapezoidal profile.

3. The method of claim 1 wherein said laser pulses are irradiated 15 times at said point of said semiconductor film.

4. The method of claim 1 wherein said laser pulses have a length of 10 to 30 cm and a width of 0.3 cm or less.

5. The method of claim 4 wherein said laser pulses have a width of 0.01 to 0.3 cm.

6. The method of claim 1 wherein said laser pulses have a wavelength of 248 nm or 308 nm.

7. A laser treating method comprising:

irradiating a laser light to an amorphous semiconductor film comprising silicon; and forming a plurality of thin film transistors using said semiconductor film irradiated with said laser light, wherein mobilities of said thin film transistors vary within ±10%, and wherein said laser beam has a focus line that extends along a longitudinal direction of said linear laser beam and coincides with a sectional shape of a surface of said semiconductor film.

8. The method of claim 7 wherein said semiconductor film is formed on a glass substrate having a size of 500 mm×500 mm, 370 mm×400 mm, 400 mm×500 mm or 550 mm×650 mm.

9. The method of claim 7 wherein said laser light has an energy density of 100 to 500 mJ/cm$^2$.

10. The method of claim 7 wherein said laser light has a length of 10 to 30 cm and a width of 0.3 cm or less.

11. The method of claim 10 wherein said laser light has a width of 0.01 to 0.3 cm.

12. The method of claim 7 wherein said laser light has a wavelength of 248 nm or 308 nm.

13. A method for producing a semiconductor device comprising:

forming an amorphous semiconductor layer comprising silicon on an insulating surface;

generating a pulse laser light in a laser oscillator;

shaping said pulse laser light into a linear pulse laser light having a focus line; and irradiating said linear pulse laser light to said semiconductor layer while moving said linear pulse laser light relatively with respect to said semiconductor layer comprising silicon approximately perpendicularly to longitudinal direction of said linear pulse laser light, to crystallize said semiconductor layer, wherein said pulse laser light has an energy variation falling within ±3% in terms of 3σ among laser pulses in said oscillator; and wherein said focus line approximately coincides with a curved surface of said insulating surface.

14. The method of claim 13 wherein said laser light has an energy density of 100 to 500 mJ/cm$^2$.

15. The method of claim 13 wherein said laser light has a length of 10 to 30 cm and a width of 0.3 cm or less.

16. The method of claim 15 wherein said laser light has a width of 0.01 to 0.3 cm.

17. The method of claim 13 wherein said laser light has a wavelength of 248 nm or 308 nm.

18. A method for producing a semiconductor device comprising:

forming an amorphous semiconductor layer comprising silicon on a silicon oxide film;

generating a pulse laser light in a laser oscillator;

shaping said pulse laser light into a linear pulse laser light having a focus line; and irradiating said linear pulse laser light to said semiconductor layer while moving said linear pulse laser light relatively with respect to said semiconductor layer comprising silicon approximately perpendicularly to longitudinal direction of said linear pulse laser light, to crystallize said semiconductor layer, wherein said pulse laser light has an energy variation falling within ±3% in terms of 3σ among laser pulses in said oscillator; and wherein said focus line approximately coincides with a curved surface of said silicon oxide film.

19. The method of claim 18 wherein said laser light has an energy density of 100 to 500 mJ/cm$^2$.

20. The method of claim 18 wherein said laser light has a length of 10 to 30 cm and a width of 0.3 cm or less.

21. The method of claim 20 wherein said laser light has a width of 0.01 to 0.3 cm.

22. The method of claim 18 wherein said laser light has a wavelength of 248 nm or 308 nm.

23. A method for manufacturing a semiconductor device comprising: irradiating a linear laser beam to a semiconductor film wherein said linear laser beam has a focus line that extends in a longitudinal direction of said linear laser beam and coincides with a sectional shape of a surface of said semiconductor film.

24. The method of claim 13, wherein said focus line has an inverted-U shape.

25. The method of claim 18, wherein said focus line has an inverted-U shape.

* * * * *